United States Patent
Windisch et al.

(10) Patent No.: US 9,620,486 B2
(45) Date of Patent: Apr. 11, 2017

(54) LIGHT-EMITTING DIODE MODULE

(71) Applicant: OSRAM GMBH, München (DE)

(72) Inventors: Reiner Windisch, Pettendorf (DE); Krister Bergenek, Regensburg (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 14/436,486

(22) PCT Filed: Oct. 16, 2013

(86) PCT No.: PCT/EP2013/071670
§ 371 (c)(1),
(2) Date: Apr. 17, 2015

(87) PCT Pub. No.: WO2014/063976
PCT Pub. Date: May 1, 2014

(65) Prior Publication Data
US 2016/0126221 A1 May 5, 2016

(30) Foreign Application Priority Data
Oct. 24, 2012 (DE) ........................ 10 2012 219 460

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/504* (2013.01); *H01L 33/56* (2013.01);
(Continued)

(58) Field of Classification Search
CPC combination set(s) only.
See application file for complete search history.

(56) References Cited

U.S. PATENT DOCUMENTS

2007/0018558 A1* 1/2007 Chua .................... G02B 6/0023
313/485
2007/0223219 A1 9/2007 Medendorp, Jr. et al.
(Continued)

FOREIGN PATENT DOCUMENTS

DE 102008025864 A1 12/2009
DE 102010034915 A1 2/2012
(Continued)

OTHER PUBLICATIONS

German Office Action based on application No. 10 2012 219 460.6 (5 pages) dated Jun. 14, 2013 (for reference purpose only).
(Continued)

*Primary Examiner* — Kyoung Lee
*Assistant Examiner* — Ratisha Mehta

(57) ABSTRACT

A light-emitting diode module for emitting white light includes a first light emitting diode chip for generating radiation in the blue spectral range having a first peak wavelength, a second light emitting diode chip for generating radiation in the blue spectral range having a second peak wavelength, a third light emitting diode chip for generating radiation in the red spectral range having a third peak wavelength, a first and a second phosphors disposed downstream of the first and the second light emitting diode chips, respectively. The first light emitting diode chip with the first phosphor generates a first mixed radiation and the second light emitting diode chip with the second phosphor generates a second mixed radiation. The first phosphor exhibits a first absorption maximum at a wavelength greater than the first peak wavelength. The second phosphor exhibits a second absorption maximum at a wavelength less than the second peak wavelength.

15 Claims, 5 Drawing Sheets

(51) Int. Cl.
  *H01L 33/56* (2010.01)
  *H01L 33/58* (2010.01)
(52) U.S. Cl.
  CPC ...... *H01L 33/58* (2013.01); *H01L 2924/0002* (2013.01); *H01L 2933/0083* (2013.01)

(56) References Cited

U.S. PATENT DOCUMENTS

2012/0267997 A1* 10/2012 Kijima ................. C09K 11/661
                                                          313/498
2013/0299857 A1   11/2013 Gaertner et al.
2014/0175478 A1    6/2014 Wirth
2014/0285088 A1    9/2014 Windisch

FOREIGN PATENT DOCUMENTS

DE   102011013504 A1   9/2012
DE   102011085645 A1   5/2013
WO     2005062391 A1   7/2005

OTHER PUBLICATIONS

Dong et al.; "Luminescence studies of Ce: YAG using vacuum ultraviolet synchrotron radiation"; Materials Research Bulletin, Elvesier, Kidlington, GB; Oct. 12, 2006.
International Search Report based on application No. PCT/EP2013/071670 (3 pages and 3 pages of English translation) dated Jan. 27, 2014 (Reference Purpose Only).

* cited by examiner

| | I1/I2 | $\frac{L1}{nm}$ | $\frac{L2}{nm}$ | ΔC | RA | $\frac{\eta}{lm/W}$ |
|---|---|---|---|---|---|---|
| A | 0,177 | 455 | 455 | 30,9 | 91 | 99,8 |
| B | 0,457 | 455 | 455 | 30,4 | 92 | 98,6 |
| C | (0,509) | 445 | 460 | 29,5 | 93 | 97,9 |
| D | (0,171) | 445 | 460 | 24,9 | 90 | 102,0 |
| E | 0,297 | 455 | 455 | 28,3 | 94 | 100,1 |

◆ 21  25°C
◇ 21  90°C
▲ 21+22  25°C
△ 21+22  90°C
● A  25°C
○ A  90°C
■ B  25°C
□ B  90°C

▲ ΔC
■ RA
● η/lm/w

LIGHT-EMITTING DIODE MODULE

RELATED APPLICATIONS

The present application is a national stage entry according to 35 U.S.C. §371 of PCT application No.: PCT/EP2013/071670 filed on Oct. 16, 2013, which claims priority from German application No.: 10 2012 219 460.6 filed on Oct. 24, 2012, and is incorporated herein by reference in its entirety.

TECHNICAL FIELD

A light-emitting diode module is specified.

SUMMARY

Various embodiments provide a light-emitting diode module which, after switch-on, exhibits a small change in a color locus of an emitted radiation.

In accordance with at least one embodiment, the module is a light-emitting diode module. That means that a main proportion or an entire radiation generated in the module is generated by optoelectronic semiconductor chips such as light-emitting diodes. The light-emitting diodes are preferably based on an inorganic semiconductor material. It is possible for the light-emitting diode module to include further semiconductor chips, not provided for generating radiation. Such semiconductor chips can serve for protection against damage from electrostatic discharges or else for driving individual radiation-generating components of the light-emitting diode module.

In accordance with at least one embodiment, the light-emitting diode module includes at least one first light-emitting diode chip. The first light-emitting diode chip is designed for generating radiation in the blue spectral range. The radiation generated by the first light-emitting diode chip during operation has a first peak wavelength. The peak wavelength is that wavelength at which a maximum intensity is generated.

In accordance with at least one embodiment, the light-emitting diode module includes one or a plurality of second light-emitting diode chips. The at least one second light-emitting diode chip is designed for generating radiation in the blue spectral range having a second peak wavelength. The first and second peak wavelengths can be identical or different from one another.

In accordance with at least one embodiment, the light-emitting diode module includes one or a plurality of third light-emitting diode chips. The at least one third light-emitting diode chip is designed to generate a radiation in the red spectral range during operation. Radiation having a third peak wavelength is therefore emitted by the third light-emitting diode chip.

The light-emitting diode chips each include a semiconductor layer sequence having at least one active layer. Preferably, the light-emitting diode chips are in each case separate, non-monolithically integrated semiconductor bodies. The active layers of the respective semiconductor bodies can preferably be energerized independently of one another. With regard to the first and second light-emitting diode chips, it is also possible for said light-emitting diode chips to include a common semiconductor body, wherein an active zone does not, however, extend continuously over the first and second light-emitting diode chips.

The semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or else an arsenide compound semiconductor material such as $Al_nIn_{1-n-m}Ga_mAs$, wherein in each case $0 \leq n \leq 1$, $0 \leq m \leq 1$ and $n+m \leq 1$. In this case, the semiconductor layer sequence may include dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances. Preferably, the first and second light-emitting diode chips are based on AlInGaN and the third light-emitting diode chip is based on AlInGaP.

In accordance with at least one embodiment, the light-emitting diode module includes a first phosphor or a first phosphor mixture. The first phosphor is disposed downstream of the first light-emitting diode chip. That means that a predominant proportion or the entire radiation emitted by the first light-emitting diode chip passes to the first phosphor. The first phosphor can be fitted indirectly or directly on the first light-emitting diode chip.

In accordance with at least one embodiment, the light-emitting diode module includes a second phosphor or a second phosphor mixture. The second phosphor is fitted directly or indirectly to the second light-emitting diode chip and is disposed downstream of the second light-emitting diode chip along a main emission direction.

In accordance with at least one embodiment, the light-emitting diode module is designed for emitting white light. White light means, for example, that a color locus of a total radiation emitted by the light-emitting diode module in the CIE standard chromaticity diagram is at a distance from the black body curve, also designated as the Planckian locus, of at most 0.03 unit or of at most 0.015 unit. The correlated color temperature, CCT for short, is preferably between 2400 K and 7000 K inclusive.

In accordance with at least one embodiment, the first light-emitting diode chip together with the first phosphor emits a first mixed radiation. Likewise, the second light-emitting diode chip together with the second phosphor emits a second mixed radiation. The color loci, also referred to as chromaticity coordinates, in the CIE standard chromaticity diagram are preferably above the Planckian locus. In particular, the mixed radiations are white-green light, designated as mint. A $c_x$ coordinate of the color locus of the mixed radiations is preferably at least 0.15 and a $c_y$ coordinate is preferably at least 0.25.

In accordance with at least one embodiment, the first phosphor has a first absorption maximum. The first absorption maximum is at a wavelength that is greater than the first peak wavelength of the radiation generated by the first light-emitting diode chip. It is possible for an absorption of the first phosphor at the first peak wavelength to increase toward greater wavelengths.

In accordance with at least one embodiment, the second phosphor has a second absorption maximum. The second absorption maximum is preferably different from the first absorption maximum. The second absorption maximum is at a wavelength that is less than the second peak wavelength. At the second peak wavelength, the absorption of the second phosphor can decrease, in the direction toward greater wavelengths. In the region of the first and/or the second peak wavelength, the first phosphor and the second phosphor, with respect to the absorption profile, can have gradients having different signs. The absorption maximum is not precluded from being at significantly shorter wavelengths than the second peak wavelength. In this regard, the second absorption maximum can also be in the ultraviolet spectral range.

In at least one embodiment, the light-emitting diode module includes at least one first light-emitting diode chip designed for generating radiation in the blue spectral range having a first peak wavelength, and at least one second light-emitting diode chip designed for generating radiation in the blue spectral range having a second peak wavelength. At least one third light-emitting diode chip of the light-emitting diode module is designed for generating radiation in the red spectral range having a third peak wavelength. A first phosphor is disposed downstream of the first light-emitting diode chip and a second phosphor is disposed downstream of the second light-emitting diode chip. The light-emitting diode module is designed for emitting white light. The first light-emitting diode chip together with the first phosphor emits a first mixed radiation and the second light-emitting diode chip together with the second phosphor generates a second mixed radiation. The first phosphor has a first absorption maximum at a wavelength that is greater than the first peak wavelength. A second absorption maximum of the second phosphor is at a wavelength that is less than the second peak wavelength.

Primarily in the case of light sources including light-emitting diodes, LEDs for short, which are intended to have a high color rendering index, RA for short, use is made of a combination of InGaN light-emitting diode chips that emit in the blue spectral range and InGaAlP light-emitting diode chips that emit in the red spectral range. These light-emitting diode chips based on different materials have a different temperature response of the efficiency. If, after the light-emitting diode module has been switched on, a temperature of the light-emitting diode chips changes until a steady-state operating temperature is reached, then this leads to a comparatively great shift in a cumulative color locus of the total radiation emitted by the light-emitting diode module.

Such a shift in the cumulative color locus takes place for example on a time scale of at least five minutes or of at least ten minutes and/or of at most 60 minutes or of at most 30 minutes or of at most 20 minutes. Such a shift after switch-on is undesirable particularly in general lighting or in the lighting of display devices having in some instances only a short average switched-on duration. In the case of safety-relevant applications, for instance in headlights for motor vehicles, such a color locus shift in some instances is likewise not tolerable.

One possibility for avoiding a color locus shift with the temperature response is an electronic correction. By this means, the temperature is measured by a sensor and then electronically readjusted by a control unit. However, this readjustment is technically comparatively complex and associated with relatively high costs. Moreover, since light-emitting diode chips have a high efficiency only in a specific current range, a cost-efficiency ratio may be reduced.

By specified choice of the peak wavelengths and of the phosphors, it is possible to achieve a small color locus shift depending on temperature in conjunction with a high efficiency and in conjunction with a high color rendering index.

The light-emitting diode module includes two different phosphors having different absorption characteristics in the blue spectral range. If the temperature of the first light-emitting diode chip rises and the peak wavelength thereof shifts toward greater wavelengths, then the relative proportion of radiation of the first light-emitting diode chip that is absorbed and converted in the first phosphor decreases. Furthermore, an increasing proportion of radiation from the second light-emitting diode chip is absorbed in the second phosphor. This has the effect, in particular, that a color locus of the total radiation emitted by the light-emitting diode module in the event of a temperature change does not shift or shifts to a lesser extent.

In the case of conventional conversion media including only one phosphor, which is based in particular on a garnet such as YAG:Ce, an emission wavelength shifts toward shorter wavelengths as the temperature increases. Since an emission from the third light-emitting diode chip, which emits in the red spectral range, also shifts toward greater wavelengths as the temperature rises, a gap forms in the total radiation spectrum emitted by the light-emitting diode module. This gap in the emission spectrum leads to a decrease in the color rendering index as the temperature of the light-emitting diode chips and of the phosphors increases. A temperature-dependent color rendering index is undesirable, however, in many applications. By virtue of the fact that the light-emitting diode module includes the two phosphors, it is possible to avoid such a spectral gap as the temperature increases toward the steady-state operating temperature and it is possible to realize a temperature-independent color rendering index.

In accordance with at least one embodiment, the first phosphor has a dominant emission wavelength of at least 570 nm or of at least 572 nm or of at least 574 nm. Alternatively or additionally, a dominant emission wavelength of the second phosphor is at most 570 nm or at most 566 nm or at most 562 nm. In this case, the dominant wavelength is, in particular, that wavelength which results as the point of intersection of the spectrum locus of the CIE standard chromaticity diagram with a straight line, wherein said straight line, proceeding from the white point in the CIE standard chromaticity diagram, runs through the actual color locus of the radiation. In general, the dominant wavelength differs from the peak wavelength.

In accordance with at least one embodiment, the first absorption maximum of the first phosphor is at least 450 nm or at least 452 nm. Alternatively or additionally, the first absorption maximum is at most 470 nm or at most 465 nm or at most 460 nm.

In accordance with at least one embodiment, the second absorption maximum of the second phosphor is at least 425 nm or at least 430 nm. Alternatively or additionally, the second absorption maximum is at most 442 nm or at most 439 nm.

In accordance with at least one embodiment, the first peak wavelength and/or the second peak wavelength are/is at least 440 nm or at least 442 nm. Alternatively or additionally, said value is at most 465 nm or at most 462 nm.

In accordance with at least one embodiment, the third peak wavelength is at least 610 nm or at least 615 nm. Alternatively or additionally, the third peak wavelength is at most 670 nm or at most 660 nm.

In accordance with at least one embodiment, a color locus of the first mixed radiation in the CIE standard chromaticity diagram lies on or within a quadrilateral having the vertexes having the following coordinates: (0.32; 0.36), (0.48; 0.48), (0.40; 0.56) and (0.32; 0.40) or (0.32; 0.40), (0.42; 0.44), (0.46; 0.50) and (0.38; 0.52). In this case, the vertexes are specified in coordinate form ($c_x$; $c_y$). This target color locus range of the first mixed radiation can be set, firstly, by a choice of the first peak wavelength and by the amount of the first phosphor disposed downstream of the first light-emitting diode chip. The indication of the color locus range thus corresponds to an indication of the proportion of the radiation to be converted by the first phosphor and the first peak wavelength.

In accordance with at least one embodiment, a color locus of the second mixed radiation lies in or on a quadrilateral having the following vertexes: (0.22; 0.20), (0.30; 0.40), (0.24; 0.46) and (0.18; 0.22) or (0.20; 0.28), (0.24; 0.26), (0.28; 0.34) and (0.24; 0.38).

In accordance with at least one embodiment, a mixed color locus from the first mixed radiation and from the second mixed radiation lies in or on a quadrilateral having the following vertexes: (0.34; 0.38), (0.42; 0.44), (0.38; 0.46) and (0.32; 0.42). A ratio of the intensities of the first mixed radiation and of the second mixed radiation is predefined by the mixed color locus. The color locus range for the mixed color locus therefore indicates in what ratio the first mixed radiation is to be mixed with the second mixed radiation.

In accordance with at least one embodiment, a color locus of the first mixed radiation together with the radiation emitted by the third light-emitting diode chip lies on the black body curve in the CIE standard chromaticity diagram, with a tolerance of at most 0.03 unit or of at most 0.015 unit. In particular, this color locus lies with the stated tolerance on the black body curve at a correlated color temperature of 3000 K.

In accordance with at least one embodiment, a higher radiation proportion of the radiation generated by the first light-emitting diode chip is absorbed by the first phosphor, relative to the radiation proportion of the second light-emitting diode chip that is absorbed by the second phosphor. In other words, the first mixed radiation then has a smaller blue proportion than the second mixed radiation.

In accordance with at least one embodiment, the first peak wavelength is less than the second peak wavelength. A wavelength difference between the peak wavelengths is then preferably at least 6 nm or at least 8 nm. Alternatively or additionally, said wavelength difference is at most 18 nm or at most 15 nm.

In accordance with at least one embodiment, the first peak wavelength is equal to the second peak wavelength, in particular with a tolerance of at most 3 nm or of at most 1 nm. In other words, the first light-emitting diode chip and the second light-emitting diode chip can then be structurally identical, within the scope of the production tolerances.

In accordance with at least one embodiment, the second light-emitting diode chip is designed to be operated with at least 15% or with at least 25% and/or with at most 60% or with at most 50% of the current density and/or of the luminous flux of the first light-emitting diode chip. The stated values with regard to the current density apply, in particular, to structurally identical first and second light-emitting diode chips. If the first light-emitting diode chip has a different active, light-generating area than the second light-emitting diode chip, the values for the current density should be correspondingly converted or the luminous flux should be used as the characteristic variable. By way of example, the light-emitting diode chips are then operated approximately with the same current density if the second light-emitting diode chip has a smaller active area than the first light-emitting diode chip.

In accordance with at least one embodiment, the light-emitting diode chips can be energized variably. In other words, during the operation of the light-emitting diode module, the relative currents of the first, second and third light-emitting diode chips can be set variably with respect to one another. As a result, a color temperature of the white light emitted by the light-emitting diode module can be tuned. In this case, a tuning range is preferably at least 1600 K or at least 2500 K or at least 3000 K. By way of example, the tuning range is between 2700 K and 6000 K inclusive. In this case, a current intensity can be regulated or pulse width modulation is employed.

In accordance with at least one embodiment, that proportion of the luminous flux emitted overall by the light-emitting diode module which is generated by the third light-emitting diode chip is at least 3% or at least 5% or at least 10%. Alternatively or additionally, said proportion is at most 30% or at most 25% or at most 20%. In other words, the third light-emitting diode chip then contributes only comparatively little to a brightness of the light-emitting diode module.

In accordance with at least one embodiment, the first phosphor is a $Y_3Al_5O_{12}$:Ce or a $Y_3(Al,Ga)_5O_{12}$:Ce. The Ce content is preferably at least 2% or at least 3% and/or at most 6% or at most 5%, in particular approximately 4%.

In accordance with at least one embodiment, the second phosphor is a $Y_3(Al,Ga)_5O_{12}$:Ce, an $(Lu,Y)_3(Al,Ga)_5O_{12}$:Ce, an $Lu_3(Al,Ga)_5O_{12}$:Ce, an orthosilicate or a nitrido-orthosilicate. The Ce proportion is preferably at least 1.5% or at least 2% and/or at most 5% or at most 4%, in particular approximately 3%. Particularly in the case of $Lu_3(Al,Ga)_5O_{12}$:Ce, the Ga proportion is preferably at least 20% and/or at most 30%, in particular approximately 25%.

In accordance with at least one embodiment, a first scattering body is disposed downstream of the first and/or the second light-emitting diode chip. The first scattering body has a smaller scattering capability at room temperature, in particular at approximately 300 K, than at a steady-state operating temperature of the light-emitting diode module. The steady-state operating temperature is, in particular, at least 350 K or 360 K and/or at most 400 K or 425 K, for instance approximately 375 K.

In accordance with at least one embodiment, the first scattering body includes a matrix material and scattering particles embedded into the matrix material. A refractive index difference between said matrix material and said scattering particles is smaller at room temperature than at the steady-state operating temperature. Preferably, the refractive index difference at room temperature is at least 0.025 or 0.03 and/or at most 0.05, and at the steady-state operating temperature is at most 0.02 or at most 0.01.

In other words, in the case of such a first scattering body, a scattering effect increases as the temperature increases toward the steady-state operating temperature. This has the effect that in the phosphor, as the temperature increases, the radiation having the first peak wavelength covers a larger average path length and a conversion efficiency of this radiation thus rises. Less radiation having the first peak wavelength or the second peak wavelength then passes from the light-emitting diode module if the temperature increases.

As the temperature increases, the absorption and the conversion efficiency of the phosphor generally decrease. This results in a shift of the resulting color locus in the direction of blue in the normal case. This effect can be at least partly compensated for by a scattering body which scatters to a greater extent as the temperature rises.

By such a scattering body, the proportion of blue light in the first and second mixed radiations can be reduced as the temperature rises toward the steady-state operating temperature and the effect of the shifting of the wavelength of the radiation emitted by the first and second light-emitting diode chips can be reduced or compensated for.

Particularly preferably, the first scattering body is integrated in a body containing the first or the second phosphor. In other words, a single lamina is then involved, for example, which is disposed downstream of the first and/or the second light-emitting diode-chip and which includes both the first scattering body and the first phosphor or the second phosphor.

In accordance with at least one embodiment, a second scattering body is disposed downstream of the third light-emitting diode chip. The second scattering body has a greater scattering capability at a temperature of 300 K than at the steady-state operating temperature of approximately 375 K. The second scattering body likewise includes a matrix material and scattering particles embedded into the matrix material, wherein a refractive index difference between said matrix material and said scattering particles is greater at room temperature than at the steady-state operating temperature. Preferably, the refractive index difference at room temperature is at most 0.05 or at most 0.04 and/or at least 0.01 or at least 0.03. At the steady-state operating temperature, the refractive index difference is, in particular, at most 0.01 or at most 0.03, preferably approximately zero.

In the case of such a second scattering body, therefore, the scattering effect decreases as the temperature increases. A transmissivity of the second scattering body to red light then likewise increases as the temperature increases toward the steady-state operating temperature. A decrease in the efficiency of the third light-emitting diode chip, toward the steady-state operating temperature, can be at least partly compensated for as a result of this.

In accordance with at least one embodiment, the first and/or the second scattering body include(s) as matrix material a silicone, a silicone-epoxy hybrid material or an epoxy. The matrix material of the first scattering body is, for example, a low refractive index silicone, for instance having a refractive index of 1.41+/−0.02 at 300 K. The matrix material of the second scattering body can be a high refractive index silicone having a refractive index of approximately 1.51+/−0.02 at room temperature. The scattering particles of the first and/or of the second scattering body are formed from one or a plurality of the materials mentioned below or consist of: a glass, quartz, silicon dioxide, a metal fluoride such as barium fluoride, calcium fluoride or magnesium fluoride. The refractive indexes of these materials for the scattering particles change only little in dependence on the temperature, in comparison with the refractive index of the matrix material.

An average diameter of the scattering particles is for example at least 50 nm or at least 150 nm or at least 250 nm or at least 400 nm. Alternatively or additionally, the average diameter of the scattering particles is at most 20 μm or at most 12 μm or at most 8 μm or at most 2 μm. A proportion by weight of the scattering particles, relative to the matrix material, is preferably at least 1% and/or at most 50% or at most 20% or at most 12% or at most 5%.

In accordance with at least one embodiment, the phosphors include phosphor particles that are embedded into a matrix material. The matrix material for the phosphor particles can be the same material as for the scattering particles. An average diameter of the phosphor particles is for example at least 2 μm or at least 3 μm or at least 5 μm. Alternatively or additionally, the average diameter is at most 20 μm or at most 15 μm or at most 40 μm. Preferably, the phosphor particles have a larger diameter than the scattering particles.

In accordance with at least one embodiment, a covering layer is disposed jointly downstream of the light-emitting diode chips. The covering layer includes at least one scattering medium. An intermixing of the radiation proportions emitted by the individual light-emitting diode chips, jointly with the phosphors, can be improved by the covering layer. The covering layer can be shaped as a covering plate disposed downstream of the light-emitting diode chips. The covering layer can likewise be a potting into which the light-emitting diode chips are embedded.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
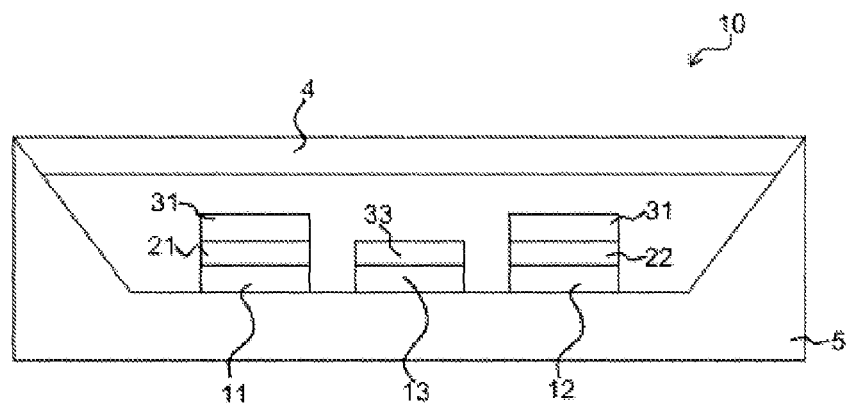
FIG. 1 shows a schematic sectional illustration of one embodiment of a light-emitting diode module described here.

FIG. 1 illustrates one embodiment of a light-emitting diode module 10. A first light-emitting diode chip 11, a second light-emitting diode chip 12 and a third light-emitting diode chip 13 are fitted to a carrier 5. The light-emitting diode chips 11, 12 are designed for generating blue light, and the third light-emitting diode chip 13 is designed for generating red light. A first phosphor 21 is assigned to the first light-emitting diode chip 11 and a second phosphor 22 is assigned to the second light-emitting diode chip 12. The phosphors 21, 22 are integrated in a laminar body, for example, and can be applied directly to the light-emitting diode chips 11, 12, for example by being printed or adhesively bonded by an adhesive.

Optionally, in each case a first scattering body 31 is disposed downstream of the two light-emitting diode chips 11, 12. In contrast to the illustration, the first scattering body 31 can be integrated in the bodies for the phosphors 21, 22. A second scattering body 33 is preferably disposed downstream of the third light-emitting diode chip 13. The first scattering bodies 31 have a more highly scattering effect as the temperature increases, toward a steady-state operating temperature. The second scattering body 33 has a decreasing or vanishing scattering effect toward the steady-state operating temperature, proceeding from room temperature.

A covering layer 4 is furthermore optionally disposed downstream of the light-emitting diode chips 11, 12, 13, said covering layer including a scattering medium for homogenizing the radiation emitted by the semiconductor chips 11, 12, 13. In contrast to the illustration, the covering layer 4 can also be realized as a potting, rather than as a plate.

In accordance with FIG. 1, in each case only one first light-emitting diode chip 11, one second light-emitting diode chip 12 and one third light-emitting diode chip 13 are present. In a departure from this, in each case a plurality of the light-emitting diode chips 11, 12, 13 can be used in the light-emitting diode module 10. In the illustration in accordance with FIG. 1, the third light-emitting diode chip 13 is situated between the two light-emitting diode chips 11, 12. A different arrangement of the light-emitting diode chips 11, 12, 13 can likewise be realized.

Optical properties and operating parameters for the embodiments mentioned below are explained in greater detail in the spectra in accordance with FIGS. 2A to 2C and the table in accordance with FIG. 3. The table in FIG. 3 indicates in each case a ratio of the currents I2 through the second light-emitting diode chip 12 and I1 through the first light-emitting diode chip 11, the peak wavelengths L1, L2 of the light-emitting diode chips 11, 12, a color locus shift ΔC, a color rendering index RA and an efficiency η. The color locus shift ΔC is indicated in MacAdam steps, relative to a temperature difference from 90° C. to 25° C. If other phosphors or light-emitting diode chips are used, then the parameters dependent thereon should be adapted accordingly in each case.

Figure 2A:
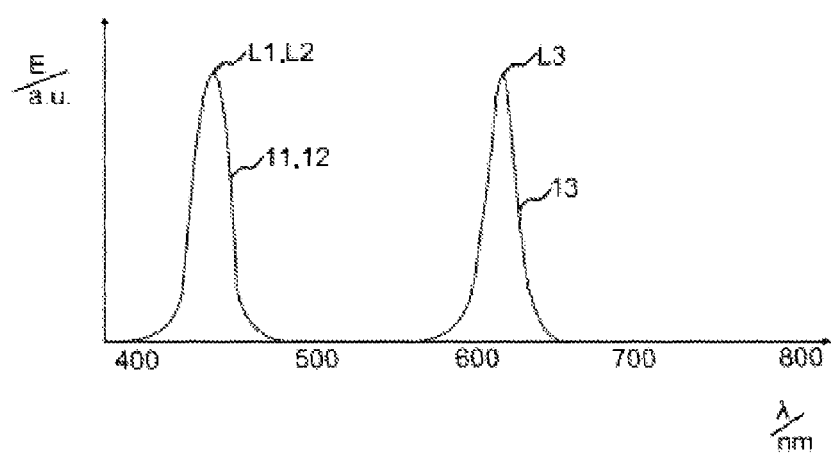
FIGS. 2A to 2C and 3-7 show schematic illustrations concerning optical properties of embodiments of light-emitting diode modules described here.

FIG. 2A illustrates emission spectra of the light-emitting diode chips 11, 12, 13 schematically and in a normalized manner. The first and second light-emitting diode chips 11, 12 have an identical peak wavelength L1, L2, which is approximately 455 nm. Such light-emitting diode chips 11, 12 are incorporated in the embodiments A, B and E. The third light-emitting diode chip 13 has in each case a third peak wavelength L3, which is approximately 625 nm. A corresponding third light-emitting diode chip 13 is used in the embodiments A to E.

Figure 2B:
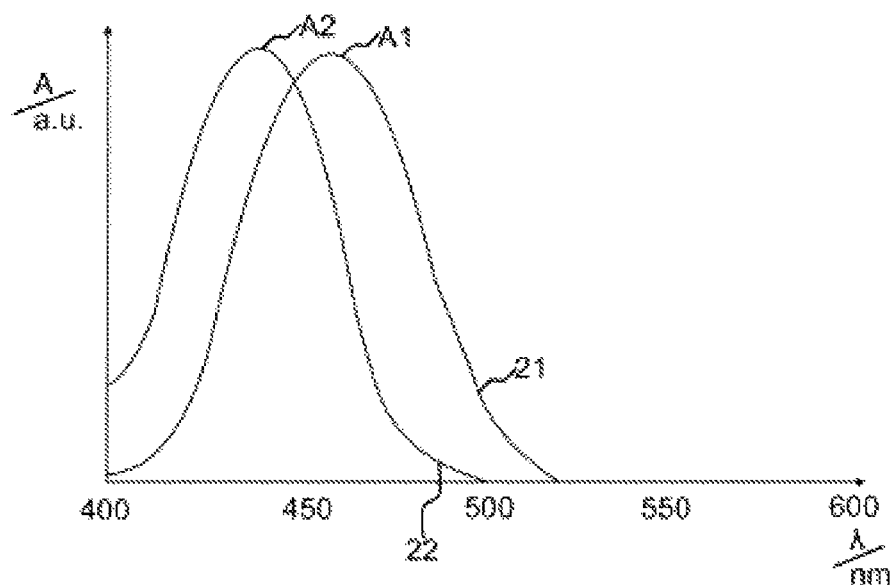
Figure 2C:
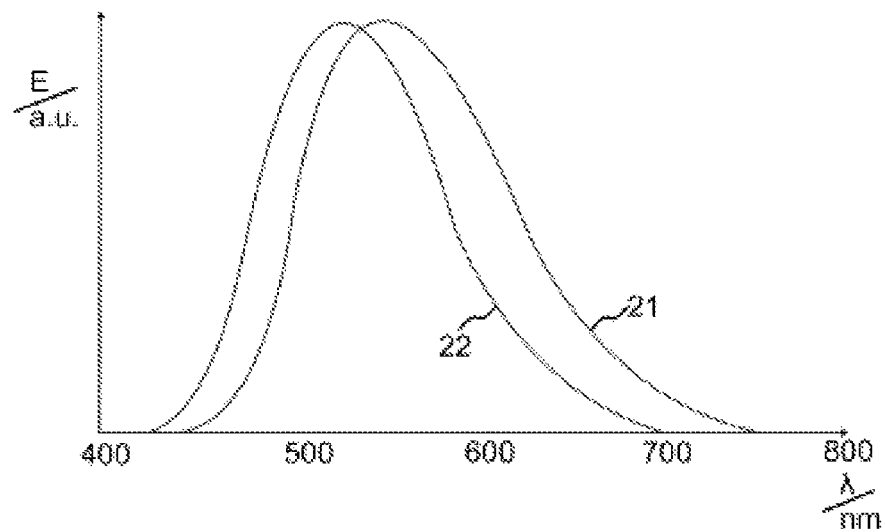

The phosphors in accordance with FIGS. 2B and 2C are likewise used for all the embodiments A to E. The first phosphor 21 has an absorption maximum A1 at approximately 460 nm. The first phosphor 21 is a YAG: Ce having a Ce content of 4%. The second phosphor 22 has an absorption maximum A2 at approximately 435 nm and is formed by an LuAGaG:Ce including 25% Ga and 3% Ce. The second phosphor 22 emits at a shorter emission wavelength than the first phosphor 21, see FIG. 2C.

In accordance with the embodiment A, also cf. FIG. 1, the light-emitting diode chips 11, 12 are respectively assigned one of the phosphors 21, 22. A color locus of the corresponding mixed radiations M1, M2, formed by a mixture of the radiation emitted by the light-emitting diode chip 11, 12 and the radiation converted by the associated phosphor 21, 22, can be seen in FIG. 4. A mixed color locus from the mixed radiations M1, M2 is likewise depicted in FIG. 4.

Figures 3, 4:
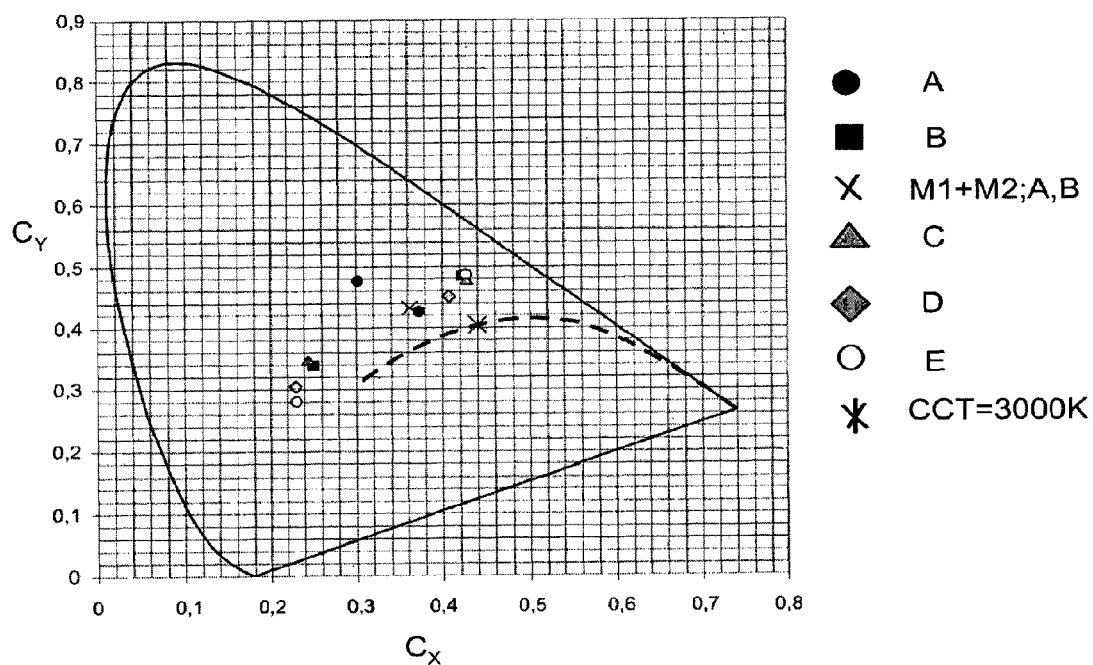

The phosphor concentrations of the phosphors 21, 22 were set in each case separately from one another such that with each of the two light-emitting diode chips 11, 12, together with the associated phosphor 21, 22, and jointly with the third light-emitting diode chip 13, a color locus at a color locus temperature of 3000 K can approximately impinge on the black body curve, see FIG. 4. The second light-emitting diode chip 12 is operated only with approximately one fifth of the current of the first light-emitting diode chip 11, the two light-emitting diode chips 11, 12 being structurally identical, see the table in FIG. 3.

Figure 5:
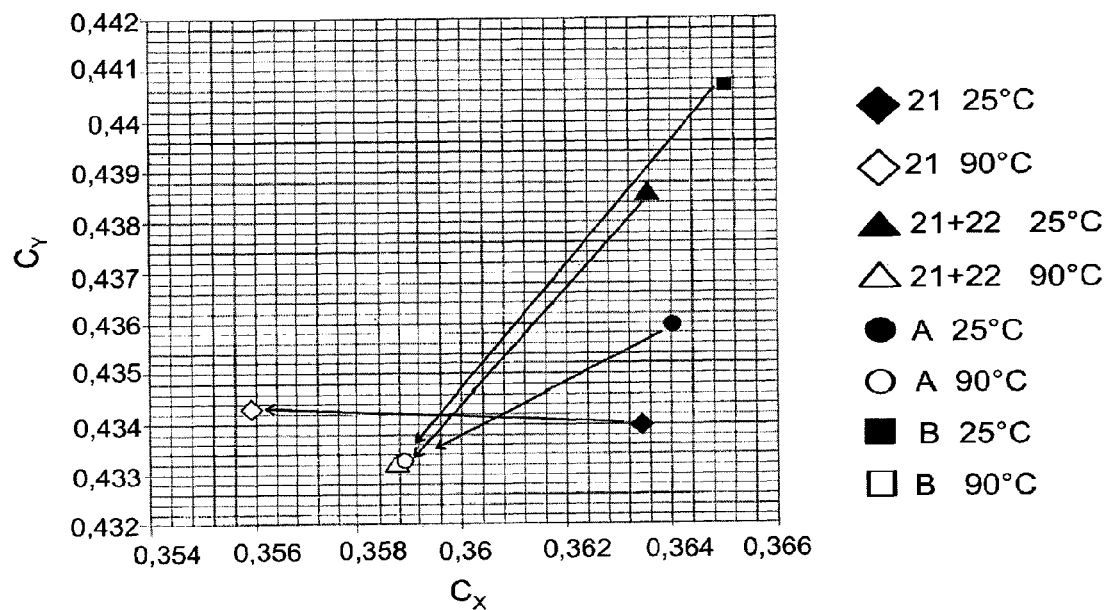

A shift ΔC in the mixed color locus from the mixed radiations M1, M2 from the light-emitting diode chips 11, 12 and the phosphors 21, 22 is illustrated in FIG. 5, relative to temperatures of 25° C. and 90° C. In comparison with a phosphor solution including only the first phosphor 21, cf. the rhombi in FIG. 5, and compared with a phosphor mixture including the phosphors 21, 22 on a single light-emitting diode chip, cf. the triangles in FIG. 5, a color locus shift is reduced in the case of the embodiment A, see the circles.

In a further embodiment B, the first phosphor 21 on the first light-emitting diode chip 11 is more highly concentrated than the second phosphor 22 on the second light-emitting diode chip 12. The mixed radiation M2 is therefore shifted further into the blue than in the embodiment A, see FIG. 4. A mixed color locus from the mixed radiations M1, M2 corresponds to that of the embodiment A, likewise see FIG. 4. As a result, a color locus shift can be reduced further toward the operating temperature, in comparison with the embodiment A, also see the squares in FIG. 5. One advantage in the case of the embodiment B is that deviations of the phosphor concentrations of the phosphors 21, 22 from a desired value in production on account of manufacturing tolerances can be adjusted by the variation of a ratio I2/I1 of currents through the light-emitting diode chips 11, 12.

In the embodiment C, also see the table in FIG. 3, the light-emitting diode chips 11, 12 have different peak wavelengths L1, L2. A difference between the peak wavelengths L1, L2 is approximately 15 nm. A higher color rendering index RA can be obtained as a result.

In the embodiment C, the first peak wavelength L1 is less than the second peak wavelength L2. As a result, the radiation emitted by the first light-emitting diode chip 11 is in a wavelength range with an absorption change of the first phosphor 21 that is greater as the temperature increases. Conversely, the second light-emitting diode chip 12 was chosen to emit at longer wavelengths, such that the absorption of the second phosphor 22 decreases to a greater extent upon a shift to higher wavelengths.

Since different light-emitting diode chips 11, 12 are used in the embodiment C, the values for the current in the table in FIG. 3 are only rough guideline values and are therefore indicted between parentheses.

In the embodiment D, the proportion of the luminous flux of the third light-emitting diode chip 13 in the total radiation of the light-emitting diode module 10 was reduced further. In the embodiment D, the mixed radiations M1, M2, see FIG. 4, moved nearer to the black body curve in the CIE standard chromaticity diagram. A distance from the black body curve is in each case preferably at most 0.7 or at most 0.6 or at most 0.5 unit.

In other words, the color loci of the mixed radiations M1, M2 are moved nearer to the color locus of the white light emitted overall by the light-emitting diode module 10. A reduction of the color rendering index RA as a result can be compensated for by the different peak wavelengths L1, L2. Furthermore, a particularly small color locus shift ΔC and a high efficiency η can be achieved, see FIG. 3.

Figure 6:
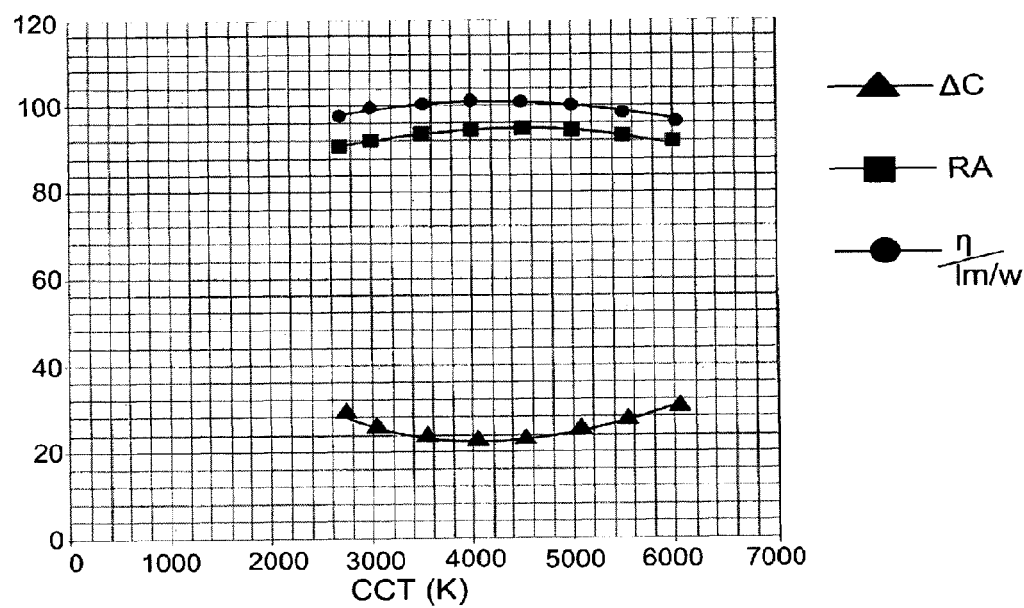

The embodiment E is based on the embodiment B. In addition, the light-emitting diode chips 11, 12, 13 can be operated electrically independently of one another. As a result, a correlated color temperature of the overall white radiation can be set over a range of 2700 K to 6000 K, see FIG. 6. The average color locus shift ΔC at a specific correlated color temperature is comparatively small in this case, likewise see FIG. 6. The color rendering index RA is in each case above 90 and the efficiency η is in each case approximately 100 lm/W.

Figure 7:
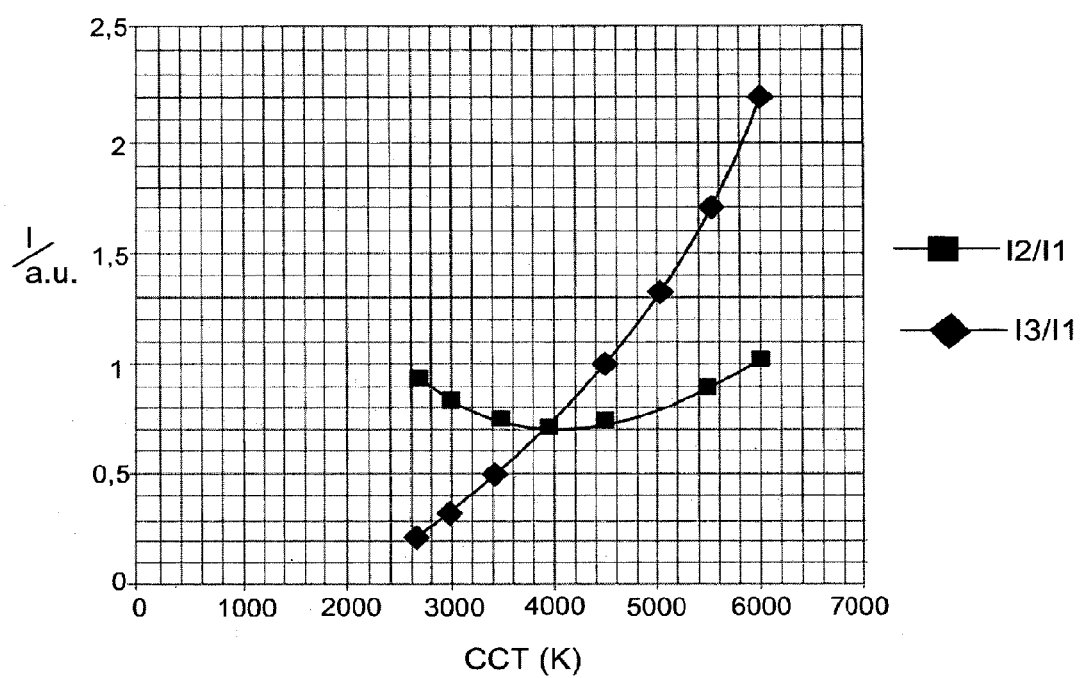

The ratios of the currents I1, I2, I3 through the light-emitting diode chips 11, 12, 13 are illustrated in FIG. 7. Since in particular the efficiency of the third light-emitting diode chip 13 based on InAlGaP can vary, the values illustrated should be understood only as rough guideline values.

In all the embodiments, the scattering bodies 31, 33 shown in association with FIG. 1 and/or the covering layer 4 can be present. The first phosphor 21 is preferably a garnet. In the embodiments illustrated, the second phosphor 22 is in each case a garnet, but can likewise be an Eu-doped ortho-silicate or nitrido-orthosilicate.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting diode module comprising:
   at least one first light-emitting diode chip designed for generating radiation in the blue spectral range having a first peak wavelength;
   at least one second light-emitting diode chip designed for generating radiation in the blue spectral range having a second peak wavelength;
   at least one third light-emitting diode chip designed for generating radiation in the red spectral range having a third peak wavelength;
   a first phosphor disposed downstream of the first light-emitting diode chip, and
   a second phosphor disposed downstream of the second light-emitting diode chip;
   wherein
   the light-emitting diode module is designed for emitting white light;
   the first light-emitting diode chip together with the first phosphor generates a first mixed radiation and the second light-emitting diode chip together with the second phosphor generates a second mixed radiation;
   the first phosphor exhibits a first absorption maximum at a wavelength that is greater than the first peak wavelength;
   the second phosphor exhibits a second absorption maximum at a wavelength that is less than the second peak wavelength; and the second light-emitting diode chip is designed to be energized with at least 15% and with at most 60% of the current of the first light-emitting diode chip.

2. The light-emitting diode module as claimed in claim 1, wherein the first phosphor has a dominant emission wavelength of greater than 570 nm and the second phosphor has a dominant emission wavelength of less than 570 nm,
   wherein the first absorption maximum of the first phosphor is between 450 nm and 470 nm inclusive and the second absorption maximum of the second phosphor is between 425 nm and 442 nm inclusive, and
   wherein the first peak wavelength and the second peak wavelength are between 440 nm and 465 nm inclusive and the third peak wavelength is between 610 nm and 670 nm inclusive.

3. The light-emitting diode module as claimed in claim 1, wherein
   a color locus of the first mixed radiation in the CIE standard chromaticity diagram is encompassed by a quadrilateral having the vertexes (0.32; 0.36), (0.48; 0.48), (0.40; 0.56) and (0.32; 0.40), wherein the vertexes are defined by the ($c_x$; $c_y$) values, a color locus of the second mixed radiation in the CIE standard chromaticity diagram is encompassed by a quadrilateral having the vertexes (0.22; 0.20), (0.30; 0.40), (0.24; 0.46) and (0.18; 0.22), and
   a mixed color locus from the mixed radiations is encompassed by a quadrilateral having the vertexes (0.34; 0.38), (0.42; 0.44), 0.38; 0.46) and (0.32; 0.42).

4. The light-emitting diode module as claimed in claim 1, wherein a higher radiation proportion of the first light-emitting diode chip is absorbed by the first phosphor in comparison with the radiation proportion of the second light-emitting diode chip that is absorbed by the second phosphor, such that the first mixed radiation has a smaller blue proportion than the second mixed radiation.

5. The light-emitting diode module as claimed in claim 1,
   wherein the first peak wavelength is less than the second peak wavelength,
   wherein a wavelength difference between the peak wavelengths is at least 6 nm and at most 18 nm.

6. The light-emitting diode module as claimed in claim 1, wherein the first peak wavelength is equal to the second peak wavelength, with a tolerance of at most 3 nm.

7. The light-emitting diode module as claimed in claim 1, wherein the light-emitting diode chips is energized variably, such that a color temperature of the white light emitted by the light-emitting diode module is tunable over a color temperature range of at least 1600 K.

8. The light-emitting diode module as claimed in claim 1, wherein that proportion of the luminous flux emitted by the light-emitting diode module which is generated by the third light-emitting diode chip is at least 3% and at most 20%.

9. The light-emitting diode module as claimed in claim 1, wherein the first phosphor is a $Y_3Al_5O_{12}$:Ce or a $Y_3(Al,Ga)_5O_{12}$:Ce.

10. The light-emitting diode module as claimed in claim 1, wherein the second phosphor is a $Y_3(Al,Ga)_5O_{12}$:Ce, an $(Lu,Y)_3(Al,Ga)_5O_{12}$:Ce, an $Lu_3(Al,Ga)_5O_{12}$:Ce, an ortho-silicate or a nitrido-orthosilicate.

11. The light-emitting diode module as claimed in claim 1,
    wherein a covering layer is disposed jointly downstream of the light-emitting diode chips,
    wherein the covering layer comprises at least one scattering medium for intermixing the radiation proportions emitted by the light-emitting diode chips.

12. The light-emitting diode module as claimed in claim 9, further comprising the first phosphor having a Cerium content of 2% to 6%.

13. The light-emitting diode module as claimed in claim 10, further comprising the second phosphor having a Cerium content of 1.5% to 5%.

14. A light-emitting diode module comprising:
    at least one first light-emitting diode chip designed for generating radiation in the blue spectral range having a first peak wavelength;
    at least one second light-emitting diode chip designed for generating radiation in the blue spectral range having a second peak wavelength;
    at least one third light-emitting diode chip designed for generating radiation in the red spectral range having a third peak wavelength;
    a first phosphor disposed downstream of the first light-emitting diode chip, and
    a second phosphor disposed downstream of the second light-emitting diode chip;
    wherein
    the light-emitting diode module is designed for emitting white light;
    the first light-emitting diode chip together with the first phosphor generates a first mixed radiation and the second light-emitting diode chip together with the second phosphor generates a second mixed radiation;

the first phosphor exhibits a first absorption maximum at a wavelength that is greater than the first peak wavelength;

the second phosphor exhibits a second absorption maximum at a wavelength that is less than the second peak wavelength; and further comprising a first scattering body being disposed downstream of the first and/or the second light-emitting diode chip, said first scattering body having a smaller scattering capability at a temperature of 300 K than at a temperature of 375 K, wherein the first scattering body comprises a matrix material and scattering particles embedded into the matrix material, and a refractive index difference between said matrix material and said scattering particles is smaller at a temperature of 300 K than at 375 K.

15. A light-emitting diode module comprising:

at least one first light-emitting diode chip designed for generating radiation in the blue spectral range having a first peak wavelength;

at least one second light-emitting diode chip designed for generating radiation in the blue spectral range having a second peak wavelength;

at least one third light-emitting diode chip designed for generating radiation in the red spectral range having a third peak wavelength;

a first phosphor disposed downstream of the first light-emitting diode chip, and a second phosphor disposed downstream of the second light-emitting diode chip;

wherein the light-emitting diode module is designed for emitting white light;

the first light-emitting diode chip together with the first phosphor generates a first mixed radiation and the second light-emitting diode chip together with the second phosphor generates a second mixed radiation;

the first phosphor exhibits a first absorption maximum at a wavelength that is greater than the first peak wavelength;

the second phosphor exhibits a second absorption maximum at a wavelength that is less than the second peak wavelength; and further comprising a second scattering body being disposed downstream of the third light-emitting diode chip, said second scattering body having a larger scattering capability at a temperature of 300 K than at a temperature of 375 K, wherein the second scattering body comprises a matrix material and scattering particles embedded into the matrix material, and a refractive index difference between said matrix material and said scattering particles is larger at a temperature of 300 K than at 375 K.

* * * * *